US009426885B2

(12) United States Patent
Spath et al.

(10) Patent No.: US 9,426,885 B2
(45) Date of Patent: Aug. 23, 2016

(54) MULTI-LAYER MICRO-WIRE STRUCTURE

(71) Applicants: Todd Mathew Spath, Hilton, NY (US); Ronald Steven Cok, Rochester, NY (US)

(72) Inventors: Todd Mathew Spath, Hilton, NY (US); Ronald Steven Cok, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 267 days.

(21) Appl. No.: 14/261,465

(22) Filed: Apr. 25, 2014

(65) Prior Publication Data

US 2015/0313008 A1 Oct. 29, 2015

(51) Int. Cl.
H05K 1/09 (2006.01)
H05K 3/24 (2006.01)
G06F 3/044 (2006.01)
G06F 3/041 (2006.01)
H05K 1/18 (2006.01)

(52) U.S. Cl.
CPC .............. *H05K 1/097* (2013.01); *G06F 3/044* (2013.01); *G06F 3/0412* (2013.01); *H05K 3/247* (2013.01); *H05K 1/189* (2013.01); *H05K 2201/035* (2013.01); *H05K 2201/0338* (2013.01); *H05K 2201/0376* (2013.01); *H05K 2201/09036* (2013.01); *H05K 2203/0108* (2013.01); *H05K 2203/1545* (2013.01)

(58) Field of Classification Search
CPC ................. G06F 3/0412; G06F 3/044; G06F 2203/04102; H05K 1/189; H05K 2201/09036; H05K 2201/0338; H05K 2201/035; H05K 3/247
See application file for complete search history.

(56) References Cited

U.S. PATENT DOCUMENTS

| 7,371,452 | B2 | 5/2008 | Bourdelais et al. |
| 8,179,381 | B2 | 5/2012 | Frey et al. |
| 8,269,404 | B2 | 9/2012 | Cho et al. |
| 9,280,225 | B2* | 3/2016 | Yeh .................. G06F 3/041 |
| 2004/0213962 | A1* | 10/2004 | Bourdelais ........... G02B 6/1221 428/172 |
| 2007/0108420 | A1* | 5/2007 | Kuramoto .......... C08G 73/0266 252/500 |
| 2008/0257211 | A1 | 10/2008 | Oriakhi |
| 2010/0328248 | A1 | 12/2010 | Mozdzyn |
| 2011/0273383 | A1* | 11/2011 | Jeon .................. G06F 3/044 345/173 |
| 2011/0303885 | A1 | 12/2011 | Vanheusden et al. |
| 2012/0003499 | A1* | 1/2012 | Chisaka ............... H05K 1/028 428/622 |

FOREIGN PATENT DOCUMENTS

CN 102063951 7/2013

* cited by examiner

Primary Examiner — Larry Sternbane
(74) Attorney, Agent, or Firm — Raymond L. Owens; Kevin E. Spaulding

(57) ABSTRACT

A multi-layer micro-wire structure resistant to cracking including a substrate having a surface, one or more micro-channels formed in the substrate, an electrically conductive first material composition forming a first layer located in each micro-channel, and an electrically conductive second material composition having a greater tensile ductility than the first material composition forming a second layer located in each micro-channel, the first material composition and the second material composition in electrical contact to form an electrically conductive multi-layer micro-wire in each micro-channel, whereby the multi-layer micro-wire is resistant to cracking.

18 Claims, 16 Drawing Sheets

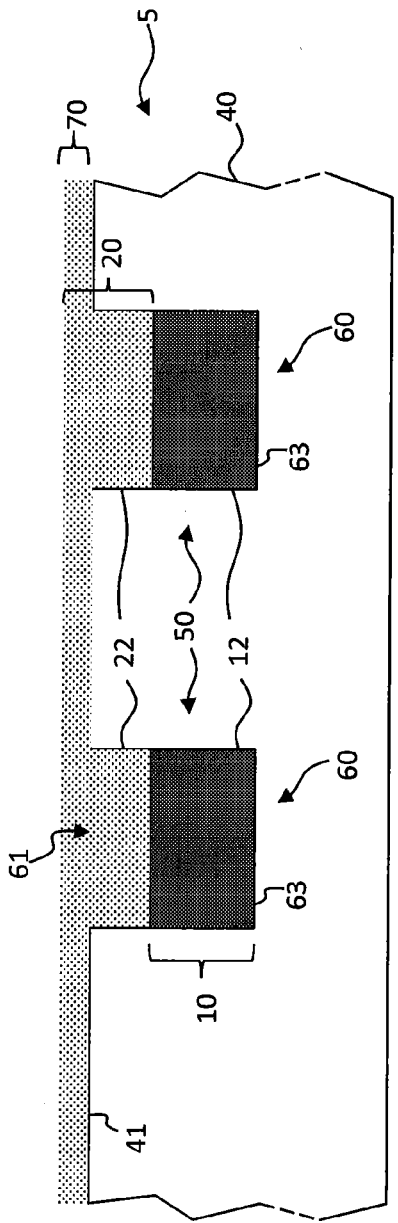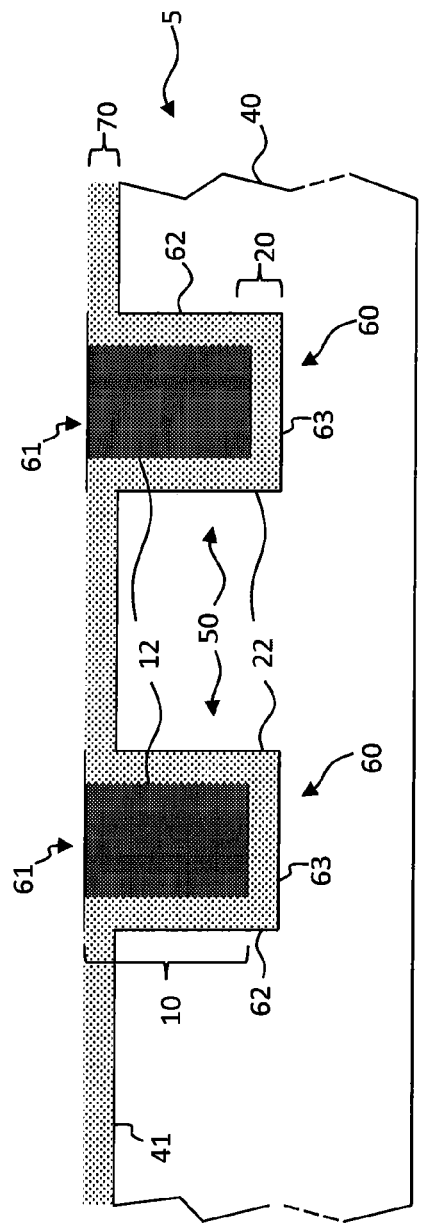

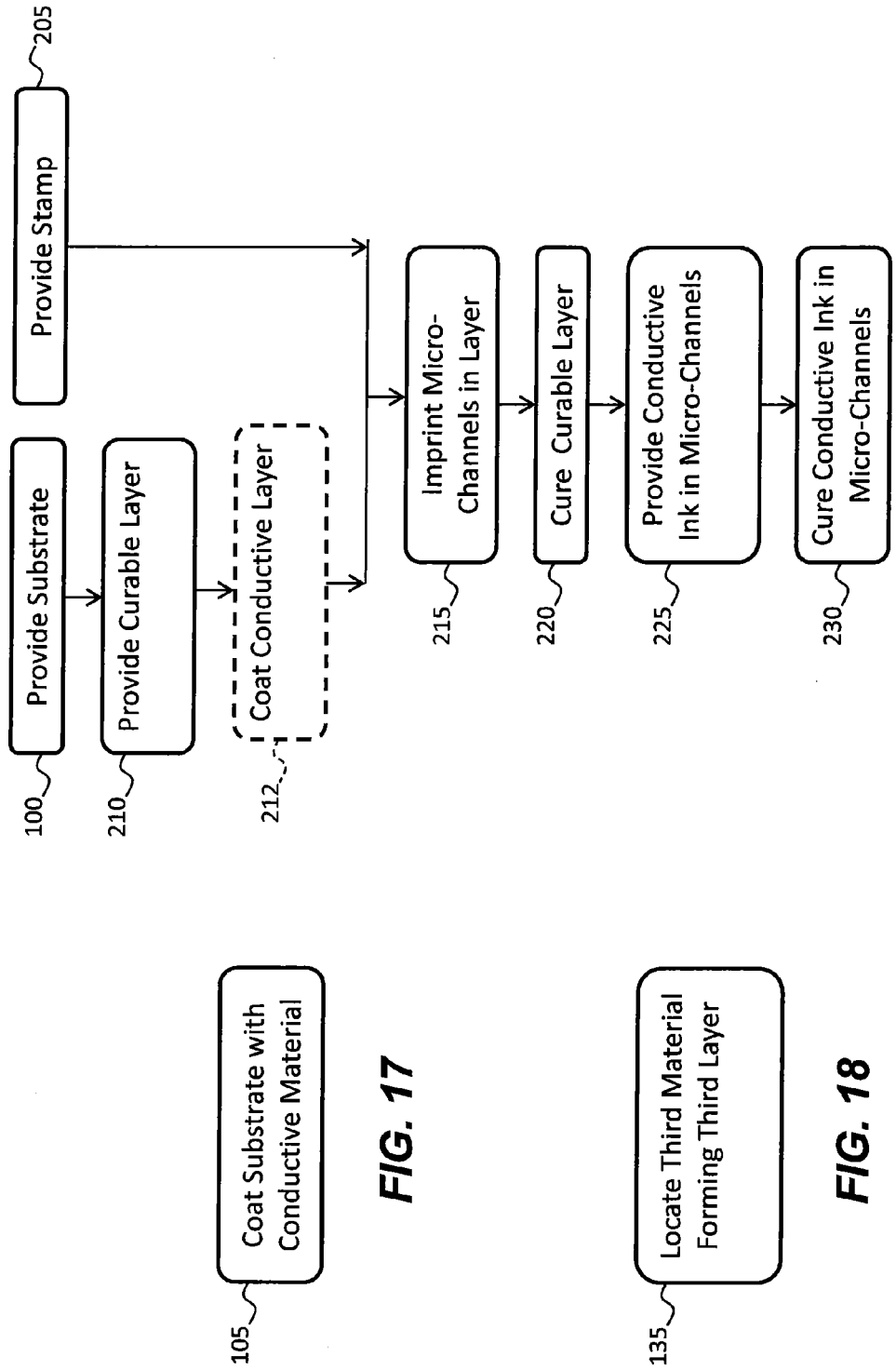

MULTI-LAYER MICRO-WIRE STRUCTURE

CROSS REFERENCE TO RELATED APPLICATIONS

Reference is made to commonly-assigned U.S. patent application Ser. No. 14/261,490 filed Apr. 25, 2014 (now U.S. Pat. No. 9,296,013 issued on Mar. 29, 2016), entitled "Making Multi-Layer Micro-Wire Structure" by Spath et al., the disclosure of which is incorporated herein.

Reference is made to commonly-assigned U.S. patent application Ser. No. 14/032,213, filed Sep. 20, 2013, entitled "Micro-Wire Touchscreen with Unpatterned Conductive Layer" by Burberry et al. (now U.S. Pat. No. 9,304,636 issued on Apr. 5, 2016), and to commonly-assigned U.S. patent application Ser. No. 13/779,917, filed Feb. 28, 2013, entitled "Multi-Layer Micro-Wire Structure" by Yau et al. (now abandoned), the disclosures of which are incorporated herein.

FIELD OF THE INVENTION

The present invention relates to micro-wire electrical conductors.

BACKGROUND OF THE INVENTION

Transparent conductors are widely used in the flat-panel display industry to form electrodes for electrically switching the light-emitting or light-transmitting properties of a display pixel, for example in liquid crystal or organic light-emitting diode displays. Transparent conductive electrodes are also used in touch screens in conjunction with displays. In such applications, the transparency and conductivity of the transparent electrodes are important attributes. In general, it is desired that transparent conductors have a high transparency (for example, greater than 90% in the visible spectrum) and a low electrical resistivity (for example, less than 10 ohms/square).

Conventional transparent conductors are typically coated on a substrate to form a patterned layer of a transparent, conductive material, such as indium tin oxide or other metal oxide. Such materials are increasingly expensive and relatively costly to deposit and pattern. Moreover, metal oxides have a limited conductivity and transparency, and tend to crack when formed on flexible substrates or when curved. Conductive polymers are also known, for example polyethylene dioxythiophene (PEDOT). However, such conductors have a relatively low conductivity and transparency.

More recently, transparent electrodes including very fine patterns of conductive micro-wires have been proposed. For example, capacitive touch-screens with mesh electrodes including very fine patterns of conductive elements, such as metal wires or conductive traces, are taught in U.S. Patent Application Publication No. 2010/0328248 and U.S. Pat. No. 8,179,381, which are hereby incorporated in their entirety by reference. As disclosed in U.S. Pat. No. 8,179,381, fine conductor patterns are made by one of several processes, including laser-cured masking, inkjet printing, gravure printing, micro-replication, and micro-contact printing. The transparent micro-wire electrodes include micro-wires between 0.5μ and 4μ wide and a transparency of between approximately 86% and 96%.

Conductive micro-wires are formed in micro-channels embossed in a substrate, for example as taught in CN102063951, which is hereby incorporated by reference in its entirety. As discussed in CN102063951, a pattern of micro-channels is formed in a substrate using an embossing technique. Embossing methods are generally known in the prior art and typically include coating a curable liquid, such as a polymer, onto a rigid substrate. The polymer is partially cured (through heat or exposure to light or ultraviolet radiation) and then a pattern of micro-channels is embossed (impressed) onto the partially cured polymer layer by a master having a reverse pattern of ridges formed on its surface. The polymer is then completely cured. A conductive ink is then coated over the substrate and into the micro-channels, the excess conductive ink between micro-channels is removed, for example by mechanical buffing, patterned chemical electrolysis, or patterned chemical corrosion. Metal nano-particle compositions are known, for example as disclosed in U.S. Patent Application Publication No. 2011/0303885. The conductive ink in the micro-channels is cured, for example by heating. In an alternative method described in CN102063951, a photosensitive layer, chemical plating, or sputtering is used to pattern conductors, for example using patterned radiation exposure or physical masks. Unwanted material (photosensitive resist) is removed, followed by electro-deposition of metallic ions in a bath.

It is useful to form many electronic devices on flexible substrates. Flexible substrates are robust in the presence of mechanical shock and enable a wide variety of useful end-product form factors that are not readily achieved with electronic devices formed on rigid substrates. In particular applications, electronic devices are formed on flexible substrates in a flat configuration and then the electronic devices and flexible substrates are bent or otherwise mechanically manipulated to form non-planar shapes, for example a cylindrical shape or portion of a cylindrical shape. Since most electronic fabrication processes rely on flat substrates, the ability to form electronic devices in a flat configuration and then bend or curve the electronic device permits conventional manufacturing equipment designed for conventionally rigid and flat substrates to be used for making devices that are ultimately used in non-flat arrangements.

Polymer layers are used to conduct light in channels formed in a substrate, for example as disclosed in U.S. Pat. No. 7,371,452. Resins used for blocking light and formed in channels are discussed in U.S. Pat. No. 8,269,404. However, these disclosures do not provide conductive micro-wires.

In useful arrangements, conductive micro-wires are used in electronic devices to form apparently transparent electrodes or to provide conductors in electronic circuits. There is a need, therefore, for robust and manufacturable micro-wire structures that enable improved conductivity in non-flat configurations.

SUMMARY OF THE INVENTION

In accordance with the present invention, a multi-layer micro-wire structure resistant to cracking, comprises:
a substrate having a surface;
one or more micro-channels formed in the substrate;
an electrically conductive first material composition forming a first layer located in each micro-channel; and
an electrically conductive second material composition having a greater tensile ductility than the first material composition forming a second layer located in each micro-channel, the first material composition and the second material composition in electrical contact to form an electrically conductive multi-layer micro-wire in each micro-channel, whereby the multi-layer micro-wire is resistant to cracking.

The present invention provides an electrically conductive micro-wire structure resistant to cracking having improved electrical conductivity and robustness that is formed in a flat configuration and used in a curved configuration.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein:

FIGS. 13-14 are cross section of alternative multi-layer micro-wire structures having an unpatterned conducting layer in an embodiment of the present invention;

FIGS. 15-19 are flow charts illustrating various methods of making the present invention.

Figure 1:
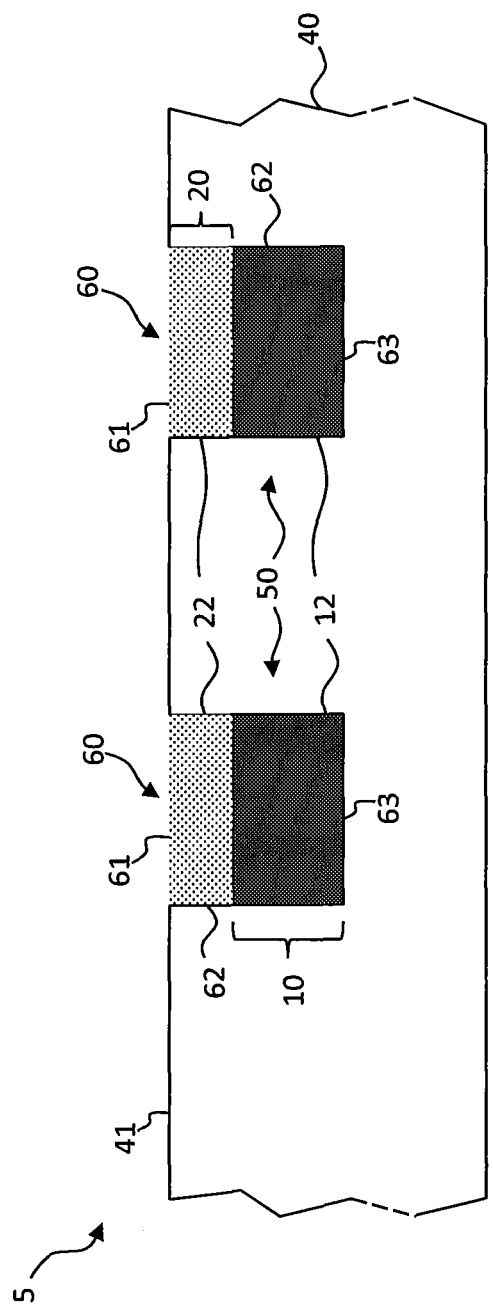
FIG. 1 is a cross section of a multi-layer micro-wire structure in an embodiment of the present invention.

The Figures are not necessarily to scale, since the range of dimensions in the drawings is too great to permit depiction to scale.

DETAILED DESCRIPTION OF THE INVENTION

The present invention is directed toward multi-layer micro-wire structures formed in a substrate that are capable of conducting electrical currents. The electrically conductive multi-layer micro-wire structures provide improved transparency, conductivity, and flexibility, especially in a curved configuration.

Referring to FIG. 1 in an embodiment of the present invention, a multi-layer micro-wire structure 5 includes a substrate 40 having a substrate surface 41. One or more micro-channels 60 are formed in the substrate 40 and extend into the substrate 40 from the substrate surface 41. The micro-channels 60 have a micro-channel bottom 63, micro-channel sides 62, and a micro-channel top 61. The micro-channel top 61 can be open and correspond to the substrate surface 41. An electrically conductive first material composition 12 forms a first layer 10 located in each micro-channel 60. An electrically conductive second material composition 22 having a greater tensile ductility than the first material composition 12 forms a second layer 20 located in each micro-channel 60. The first material composition 12 and the second material composition 22 form an electrically conductive multi-layer micro-wire 50 in each micro-channel 60. The micro-channel 60 can be completely or only partially filled with the first and second layers 10, 20. In a useful embodiment, the substrate 40 is a transparent or flexible substrate 40.

Figure 2:
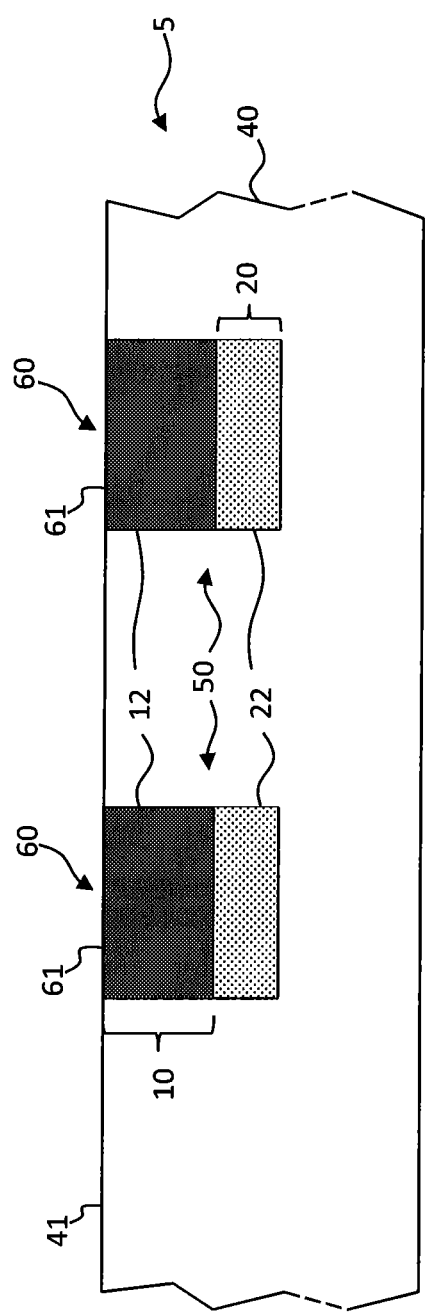
FIG. 2 is a cross section of another multi-layer micro-wire structure in an embodiment of the present invention.

As shown in FIG. 1, the second material composition 22 is between the first material composition 12 and the substrate surface 41 of the substrate 40 or micro-channel top 61. Alternatively, as shown in FIG. 2, the first material composition 12 is between the second material composition 22 and the substrate surface 41 of the substrate 40 or micro-channel top 61 of the micro-channel 60. In either configuration, multi-layer micro-wire 50 includes both the first layer 10 and the second layer 20. In one arrangement of the present invention, the first layer 10 is thicker than the second layer 20 or is more conductive. In another arrangement of the present invention, the second layer 20 is thicker than the first layer 10. In different embodiments, first layer 10 is more electrically conductive than second layer 20 or second layer 20 is more electrically conductive than first layer 10. First or second layer 10, 20 can have different optical properties.

Figure 3:
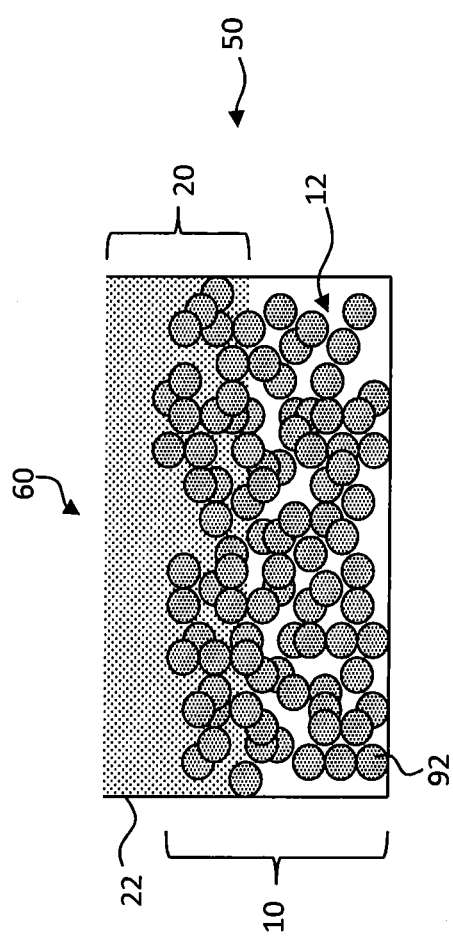
FIG. 3 is a more detailed cross section of the multi-layer micro-wire structure corresponding to the embodiment of FIG. 1.
Figure 4:
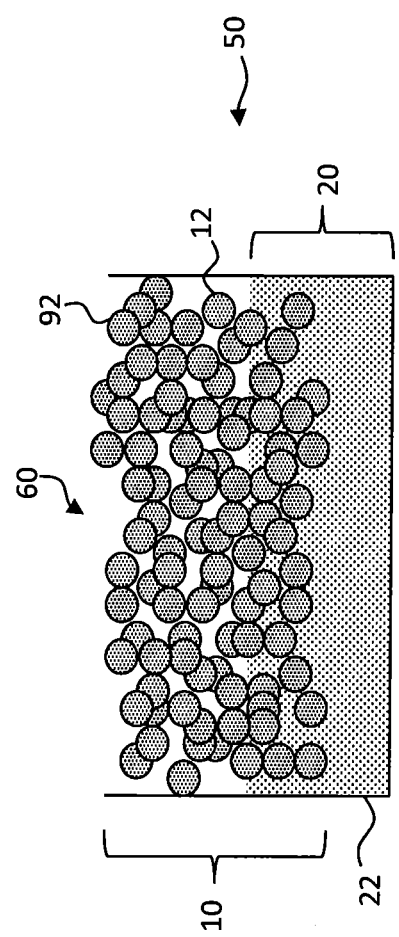
FIG. 4 is a more detailed cross section of the multi-layer micro-wire structure corresponding to the embodiment of FIG. 3.

In an embodiment, the first and second layers 10, 20 of the multi-layer micro-wire structure 5 form separate layers in the micro-channel 60 that have a clearly defined interfacial boundary separating the first and second layers 10, 20. Referring to FIGS. 3 and 4, in another arrangement the first material composition 12 infuses the second material composition 22 or alternatively the second material composition 22 infuses the first material composition 12 so that the first and second layers 10, 20 can overlap. By infuse is meant that at least a portion of the second material composition 22 of the second layer 20 intermingles with at least a portion of the first material composition 12 of the first layer 10. FIG. 3 corresponds to the layer arrangement of FIG. 1 and FIG. 4 corresponds to the layer arrangement of FIG. 2. The second material composition 22 in the second layer 20 infuses a portion of the first layer 10, for example some but not all of the first material composition 12 of the first layer 10 is coated by the second material composition 22. Elements of the first material composition 12 are on the surface of the first layer 10 and the second layer 20 and also within the first layer 10 and the second layer 20, thereby forming two at least partially intermingled layers. Infusing the first material composition 12 of the first layer 10 with the second material composition 22 of the second layer 20 improves electrical conductivity between the first and the second layers 10, 20 particularly, as discussed further below, when the multi-layer micro-wire 50 is stressed or strained by bending or folding the multi-layer micro-wire 50 and the substrate 40.

Because the second material composition 22 has greater tensile ductility than the first material composition 12, the second material composition 22 maintains its electrical conductivity when subjected to bending or folding better than the first material composition 12 and the second material composition 22 conducts electricity along the multi-layer micro-wire 50 even if the first material composition 12 is fractured or absent.

As shown in the embodiments of FIGS. 3 and 4, the first material composition 12 includes conductive particles 92, for example a cured conductive ink including metal or metallic nano-particles that are sintered together and cured to form an electrical conductor. Conductive inks including metallic nano-particles that are cured, for example by heating, to form micro-wires are known. In another embodiment, the second material composition is, or includes, a conductive polymer, PEDOT, or a polyaniline. In an embodiment, the sintered nano-particles of the first material composition 12 form a porous solid and the second material composition 22 infuses the pores within the first material composition 12 without breaking electrical connections between the conductive particles 92 or otherwise disturbing the solid first material composition 12. By infusing the first material composition 12 with the second material composition 22, the electrical conductivity of the first material composition 12 is maintained and effective electrical conductivity between the first material composition 12 and the second material composition 22 is provided. Experiments have demonstrated that sintered conductive inks have poor tensile strength, are more brittle, but have better electrical conductivity than conductive polymers. Conductive polymers are more ductile but have a lower electrical conductivity than cured nano-particle inks. Thus, the multi-layer micro-wire 50 of the present invention provides both improved electrical conductivity and ductility, especially under mechanical strain.

Experiments have demonstrated that micro-wires including sintered conductive particles 92 found in conductive inks are susceptible to cracking when physically manipulated, for example by folding or bending the substrate 40 (FIGS. 1 and 2). Such cracks reduce the conductivity of cured conductive inks or form an electrical open that does not conduct electricity. In other experiments, it has been demonstrated that the process of locating conductive inks in the micro-channels 60 can in some cases fail to completely fill the micro-channels 60 and the process of curing the conductive ink in the micro-channels 60 can result in cracks that extend partially through the cured conductive ink and reduce conductivity or result in cracks that extend completely through the cured conductive ink resulting in electrical opens. For example, the surface energy of the micro-channel 60 micro-channel side 62 or micro-channel bottom 63 (FIG. 1) can prevent the conductive ink from coating the micro-channel 60 thoroughly and, as the conductive ink cures (for example by drying or heating), the conductive ink can form micro-cracks that reduce or eliminate electrical conductivity in the cured conductor.

Figure 5:
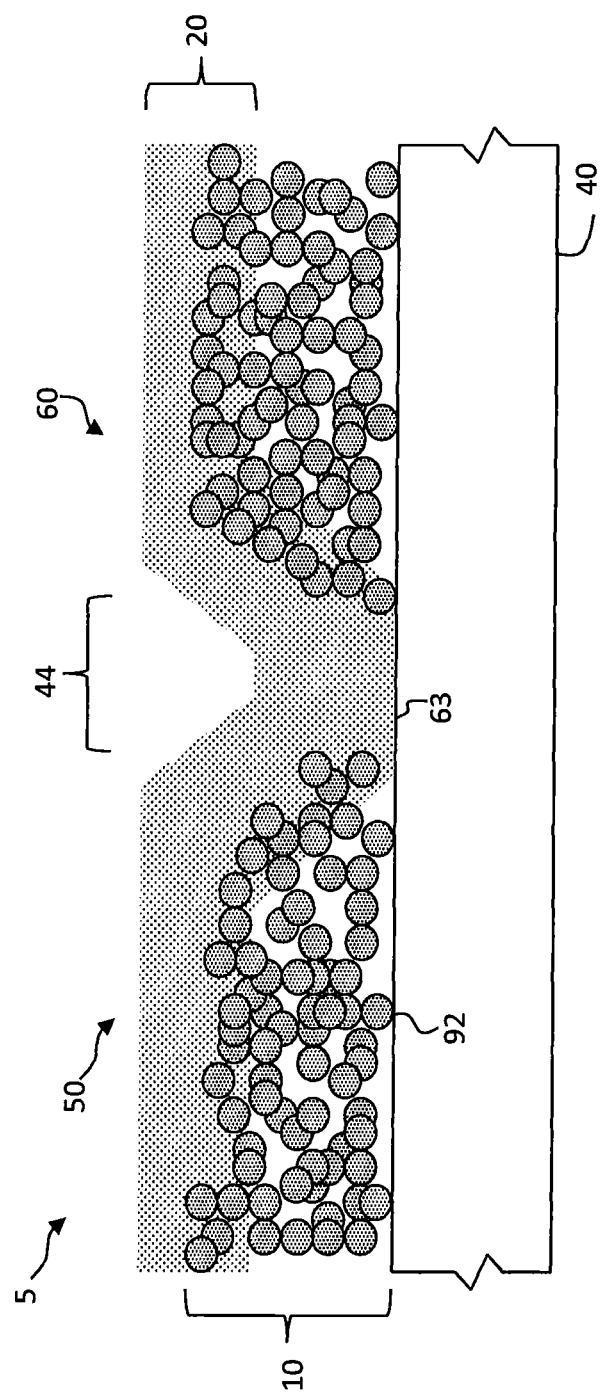
FIG. 5 is a cross section of a multi-layer micro-wire structure with a gap in an alternative embodiment of the present invention.

Thus, referring to FIG. 5, in another embodiment of the present invention at least one multi-layer micro-wire 50 in substrate 40 includes at least one crack in the first material composition 12 in the first layer 10 forming a gap 44 in the first material composition 12 where the first material composition 12 is partially or completely absent in the micro-channel 60. The second material composition 22 in the second layer 20 forms an electrical connection that bridges the gap 44. FIG. 5 illustrates a cross section of the multi-layer micro-wire 50 along the length of the multi-layer micro-wire 50 rather than across the width of multi-layer micro-wire 50 as in FIGS. 1-4. The second layer 20 and the second material composition 22 can, but need not, extend to the micro-channel bottom 63 of the micro-channel 60 in which the multi-layer micro-wire 50 is formed. The second material composition 22 conducts electricity from one side of the gap 44 to the other, thereby improving the conductivity of the multi-layer micro-wire 50.

Figure 6:
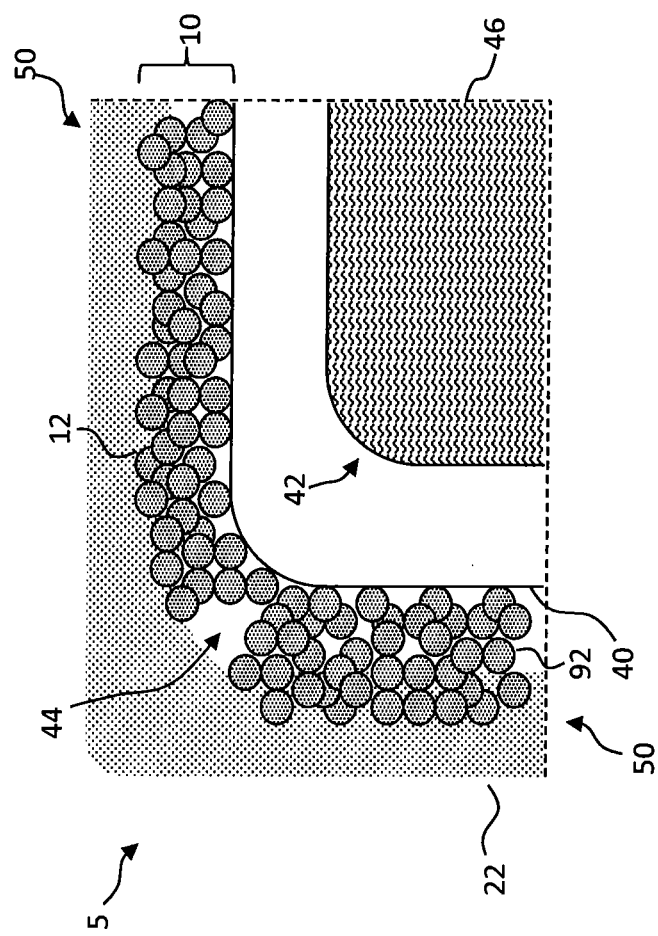
FIG. 6 is a cross section of a multi-layer micro-wire structure with a gap in a curved embodiment of the present invention.

Referring further to FIG. 6 in another lengthwise cross section of multi-layer micro-wire 50, a corner 42 of an object 46 is shown with the multi-layer micro-wire 50 of the present invention bent or wrapped around the corner 42 by bending or wrapping the substrate 40 into a three-dimensional configuration, for example around another object 46, such as a display. A micro-crack in the first material composition 12 forms a gap 44 that impedes the flow of electricity through the first material composition 12. The second material composition 22 bridges the gap 44 to improve the current flow through the multi-layer micro-wire 50. Note that in both FIGS. 5 and 6, it is possible that the gap 44 forms an electrical open in the first material composition 12 or that the conductivity of the first material composition 12 is reduced but not eliminated. Alternatively, in an embodiment the micro-crack forming the gap 44 is a partial crack that does not extend all of the way through the first material composition 12 of the first layer 10. In an embodiment in which conductive particles 92 form a substantial part of the first layer 10, a gap 44 can result when the number of conductive particles 92 that are sintered together across the micro-channel 60 in the gap 44 is smaller than the number of sintered conductive particles 92 elsewhere in the multi-layer micro-wire 50. As illustrated in FIG. 6, a single conductive particle 92 conducts electricity across the gap 44 around the corner 42 of the object 46 and on the substrate 40. Elsewhere in the first layer 10, two or more conductive particles conduct electricity along the length of the first layer 10. Thus, according to an embodiment of the present invention, the gap 44 is an area of reduced conductivity in the first material composition 12 of the first layer 10. The gap 44 is formed in various ways, particularly by coating a conductive ink, curing a conductive ink, or stressing or straining a cured conductive ink. The present invention is not limited by the way in which the gaps 44 are formed, or whether the gaps 44 have reduced or partial conductivity or are completely non-conductive thereby forming an electrical open.

As is readily understood by those knowledgeable in the mechanical and electrical arts, stressing or straining a conductor by bending it around a corner or into a three-dimensional configuration can form micro-cracks in the conductor that inhibits the flow of electricity along the conductor. Because the second material composition 22 has greater tensile ductility than the first material composition 12, the second material composition 22 is more resistant to mechanical strain and less likely to develop cracks. Hence, the present invention provides improved electrical conductivity and resistance to stress or strain in a conductor, especially when formed in a flexible substrate 40 that is flexed, bent, curved, or wrapped around another object.

Thus, the multi-layer multi-wire structure 5 of the present invention provides a parallel conductive path along the micro-channels 60 in the substrate 40 parallel to the substrate surface 41 such that the net conductivity of the multi-layer multi-wire 50 is enhanced even if one layer (the more brittle layer, e.g. the first layer 10) is more electrically conductive but has defects, faults, or flaws, for example produced by mechanical strain or difficulty in coating or curing. The first and second material compositions 12, 22 are in electrical contact where the second material composition 22 is infused with the first material composition 12 and the second material composition 22 provides electrical conductivity where defects, faults, or flaws in the first material composition 12 are present.

Figure 7:
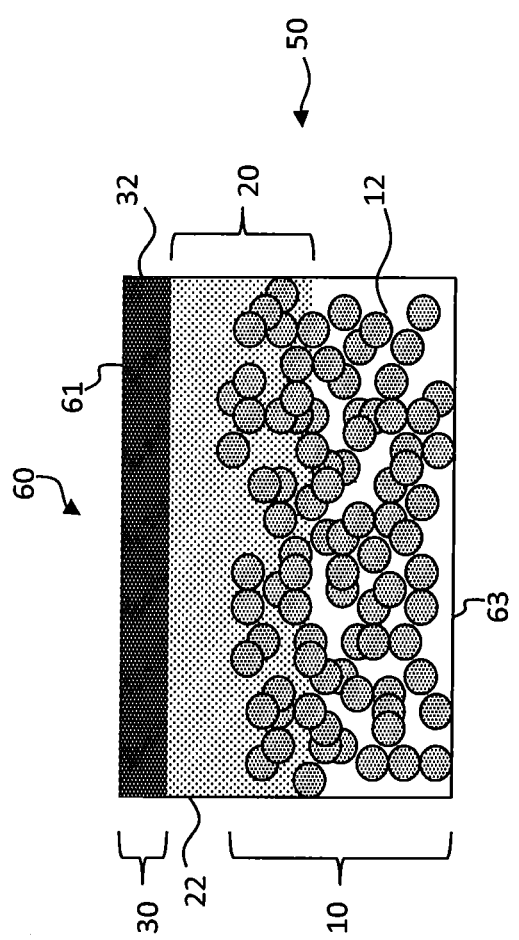
FIG. 7 is a cross section of a multi-layer micro-wire structure having a third layer in an embodiment of the present invention.

In a further embodiment of the present invention, the first or second material composition 12, 22 is light-absorbing or includes carbon black. Alternatively, as shown in FIG. 7, in an embodiment of the present invention, the multi-layer micro-wire 50 in the micro-channel 60 includes a third layer 30 located in the micro-channel 60 on a side of the second layer 20 opposite the first layer 10. In one embodiment, the third layer 30 includes a third material composition 32 that is different from either the first or the second material compositions 12, 22. The third material composition 32 can be light absorbing and include, for example, carbon black. If the third material composition 32 is electrically conductive, in an embodiment it is a part of the multi-layer micro-wire 50.

Figure 8:
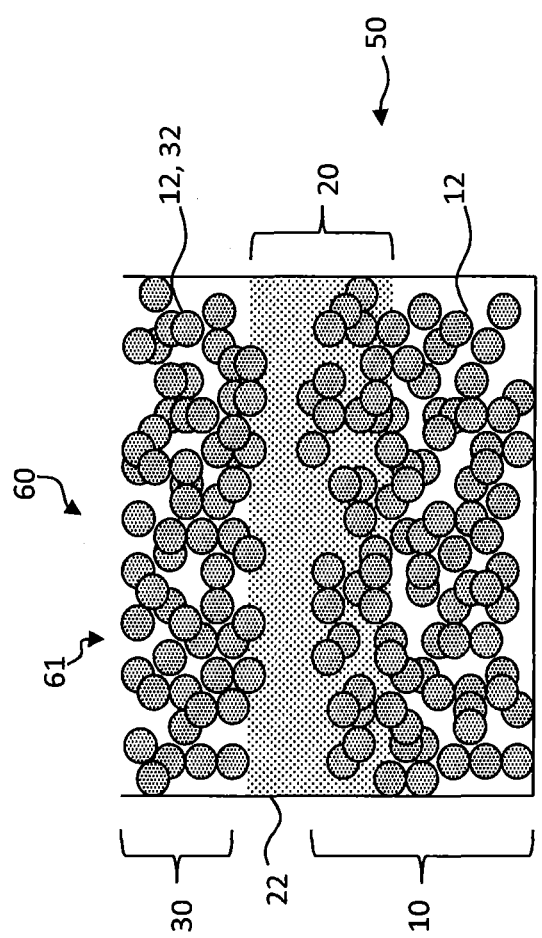
FIGS. 8-11 are cross sections of various multi-layer micro-wire structures having a third layer in alternative embodiments of the present invention.

Referring to FIG. 8 in another embodiment, the third material composition 32 in the third layer 30 is the same as or includes the first material composition 12 in the first layer 10 and is a part of the multi-layer micro-wire 50. In this embodiment, as in FIG. 7, the third layer 30 is located in the micro-channel 60 on a side of the second material composition 22 of the second layer 20 opposite the first layer 10 and adjacent to the micro-channel top 61.

Figure 9:
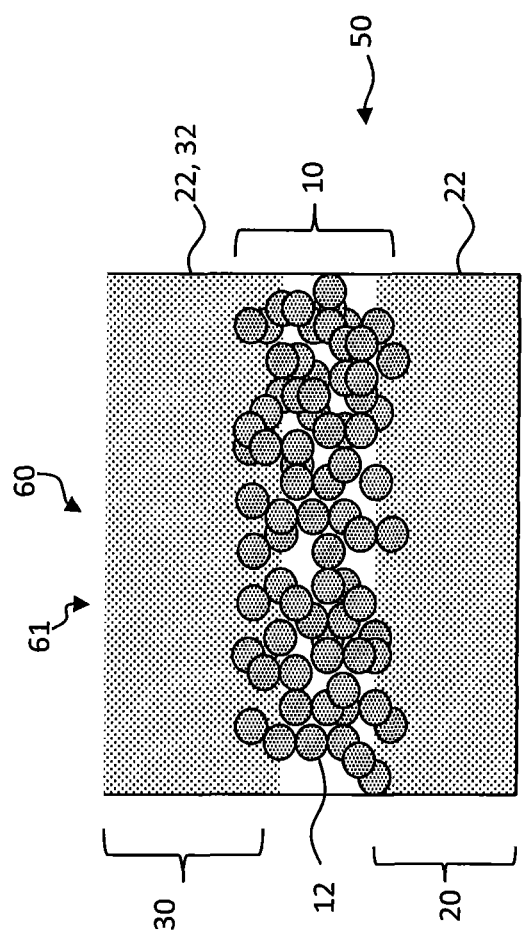

Referring to FIG. 9 in a different embodiment of the multi-layer micro-wire 50, the third material composition 32 in the third layer 30 is the same as or includes the second material composition 22 in the second layer 20 and is a part of the multi-layer micro-wire 50. In this embodiment, the third layer 30 is located in the micro-channel 60 on a side of the first material composition 12 of the first layer 10 opposite the second layer 20 and adjacent to the micro-channel top 61. In either of the embodiments illustrated in FIGS. 8 and 9, the greater tensile ductility of the second material composition 22 improves the net conductivity of the first material composition 12 in the presence of cracks or gaps 44 (FIGS. 5, 6) in the first material composition 12.

Figure 10:
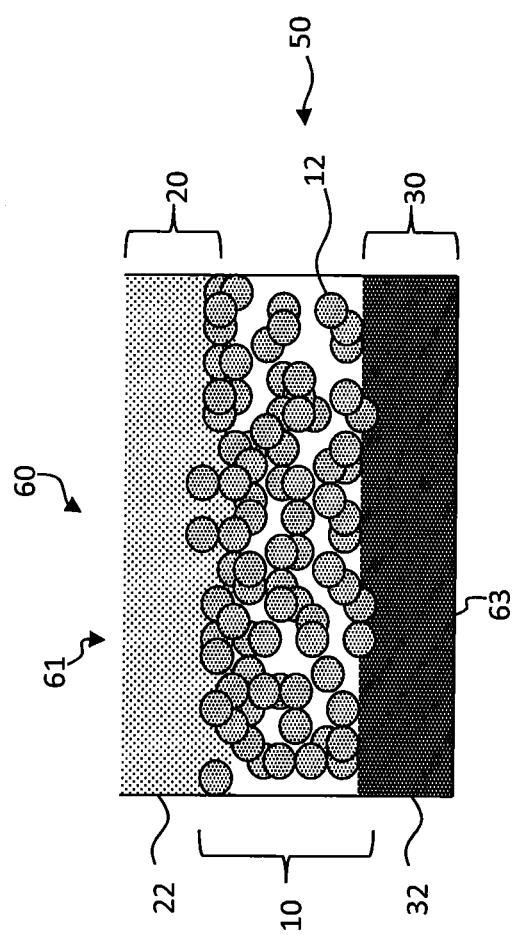
Figure 11:
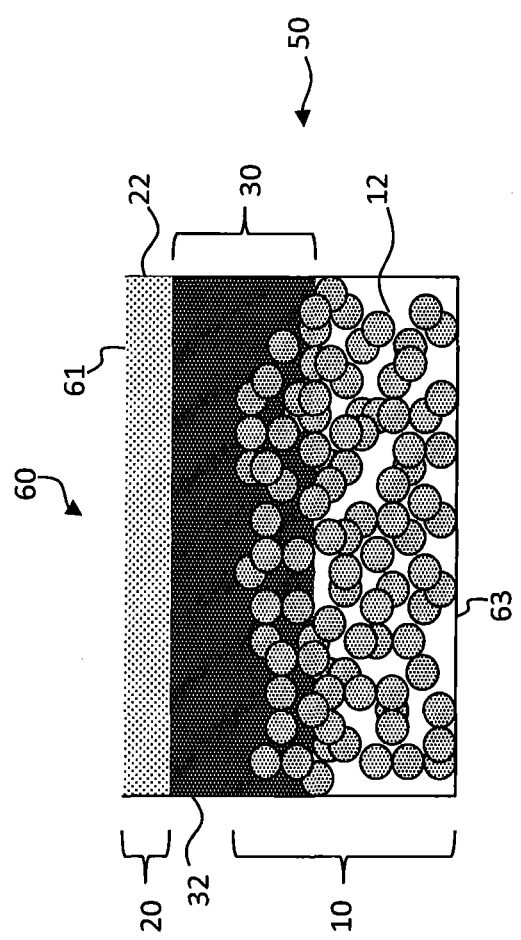

In various embodiments of the multi-layer micro-wire 50, the electrically conductive third material composition 32 forms a third layer 30 located in the micro-channel top 61 of the micro-channel 60 (FIG. 7), located in the micro-channel 60 between the first and second layers 10, 20 (FIG. 9), or located on the micro-channel bottom 63 of the micro-channel 60 (FIG. 10) to form the multi-layer micro-wire 50 of the present invention. Referring to FIGS. 10 and 11, the electrically conductive third material composition 32 in the third layer 30 can enhances the conductivity of the multi-layer micro-wire 50 by providing greater tensile ductility than the first material composition 12 or the second material composition 22 or by providing increased electrical conductivity. As shown in FIG. 10, the first layer 10 is between the second layer 20 at the micro-channel top 61 and the third layer 30 at the micro-channel bottom 63. As shown in FIG. 11, the third layer 30 is between the second layer 20 at the micro-channel top 61 and the first layer 10 at the micro-channel bottom 63.

Figure 12:
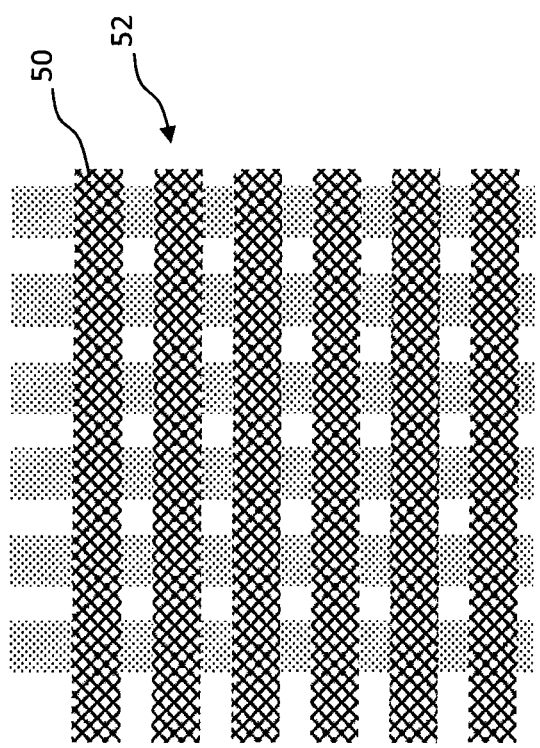
FIG. 12 is a plan view of two arrays of electrodes in separate layers and extending in orthogonal directions useful in understanding the present invention.

Turning to FIG. 12, in an embodiment, the multi-layer micro-wires 50 of the present invention are used to form one or more layers of a plurality of separate, spaced-apart electrodes 52, each electrode 52 including a plurality of electrically connected multi-layer micro-wires 50. In FIG. 12, for clarity only the multi-layer micro-wires 50 of the top layer and horizontal electrodes 52 are shown. In an embodiment, the electrodes 52 are electrically disconnected.

Figure 20:
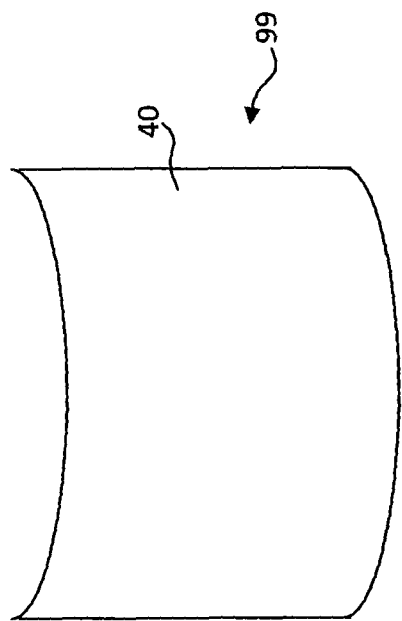
FIG. 20 is a perspective of a three-dimensional substrate in a curved capacitive touch screen according to an embodiment of the present invention.

In an embodiment, the arrays of electrodes 52 are used to form a capacitive touch screen. In such an embodiment, the multi-layer micro-wires 50 of the present invention can form the electrical conductors of sense electrodes or drive electrodes. In a further embodiment, the capacitive touch screen is curved or wrapped around a corner or edge of a three-dimensional object, or has a three-dimensional configuration. Thus, the present invention enables a curved capacitive touch screen 99 that has a three-dimensional configuration, is curved, is wrapped around a corner or edge of a three-dimensional object or surface, or is adhered to a curved or three-dimensional surface, such as a cylinder, as shown in FIG. 20. By having a three-dimensional configuration is meant that the substrate surface 41 of the substrate 40 is not substantially flat or planar, or is perceptibly curved to an observer or user in at least one dimension.

Referring back to FIG. 2, the electrically conductive first material composition 12 in the first layer 10 is located only in each micro-channel 60 and not on the substrate surface 41, as shown. Alternatively, as shown in FIG. 1, the electrically conductive second material composition 22 in the second layer 20 is located only in each micro-channel and not on the substrate surface 41. The first and second layers 10, 20 are not necessarily flat or planar and, as noted above, can intermingle or are located together in a variety of configurations.

As shown in FIG. 12, the multi-layer micro-wires 50 form the separate, spaced apart electrodes 52 located in the micro-channels 60 (FIG. 1). In the embodiments of FIGS. 13 and 14, in addition to the multi-layer micro-wires 50 an unpatterned conductive layer 70 is electrically connected to the multi-layer micro-wires 50 and thus electrically connects the multi-layer micro-wires 50 and electrodes 52 (FIG. 12) and the multi-layer micro-wires 50. The unpatterned conductive layer 70 is electrically connected to the first layer 10, the second layer 20, or both. In an embodiment, the unpatterned conductive layer 70 has the second material composition 22 and is formed in a common coating step with the second layer 20. Essentially, the unpatterned conductive layer 70 is the portion of the second material composition 22 between the micro-channels 60 on the substrate surface 41. Alternatively, the unpatterned conductive layer 70 includes the second material composition 22 of the multi-layer micro-wire 50 since, in an embodiment they are formed of the same materials in a common step. In an embodiment, the unpatterned conductive layer 70 is an isotropically conductive optically clear adhesive (OCA). Such an electrically conductive optically clear adhesive can adhere other elements in a device, for example another substrate 40, a dielectric layer, a protective layer, or cover glass to the multi-layer micro-wire structure 5. An electrically conductive optically clear adhesive forming the unpatterned conductive layer 70 can adhere a drive electrode layer to the substrate of a sense electrode layer in a capacitive touch screen.

As discussed with reference to FIGS. 1 and 2, either the first material composition 12 is between the second material composition 22 and the substrate surface 41 or the second material composition 22 is between the first material composition 12 and the substrate surface 41. FIG. 13 corresponds to the arrangement of FIG. 1. In FIG. 13, the second material composition 22 is coated over the substrate surface 41 and the first material composition 12 to form the second layer 20 and the unpatterned conductive layer 70. The first material composition 12 and the first layer 10 are therefore at the micro-channel bottom 63 of the micro-channels 60 and are typically coated before the second material composition 22.

In contrast, referring to FIG. 14, the second material composition 22 is deposited first and coats the substrate surface 41, and the micro-channel sides (walls) 62 and the micro-channel bottom 63 of the micro-channels 60 in the substrate 40. The first material composition 12 of the first layer 10 is then coated in the micro-channels 60 and over the second material composition 22 of the second layer 20. The unpatterned conductive layer 70 is the same as that of FIG. 13, but the first material composition 12, as in FIG. 2, is over the second material composition 22 and can extend to the substrate surface 41 and the micro-channel top 61 in the micro-channels 60 to form the multi-layer micro-wires 50. In an embodiment, the unpatterned conductive layer 70 is only a few microns thick, for example less than 20 microns, less than 10 microns, less than 5 microns, or less than 2 microns thick. Alternatively, the unpatterned conductive layer 70 has the same thickness as the second layer 20 or is thinner than the second layer 20.

As noted above, the unpatterned conductive layer 70 can include the second material composition 22. Alternatively, the unpatterned conductive layer 70 includes the first material composition 12.

Multi-layer micro-wires 50 of the present invention are useful in forming wires to connect electrical components on a substrate, particularly substrates that are flexible or that are flexed. In an embodiment, the multi-layer micro-wires 50 form electrodes that are used in capacitive touch screens. Multi-layer micro-wire structures 5 of the present invention are operated by providing electrical signals to the multi-layer micro-wires 50 or by sensing electrical signals from the multi-layer micro-wires 50. Integrated circuits and electrical circuits using or connected to electrically conductive wires are commonly used and known in electrical system designs and the present invention is not limited to any particular design, structure, or application.

Figure 15:
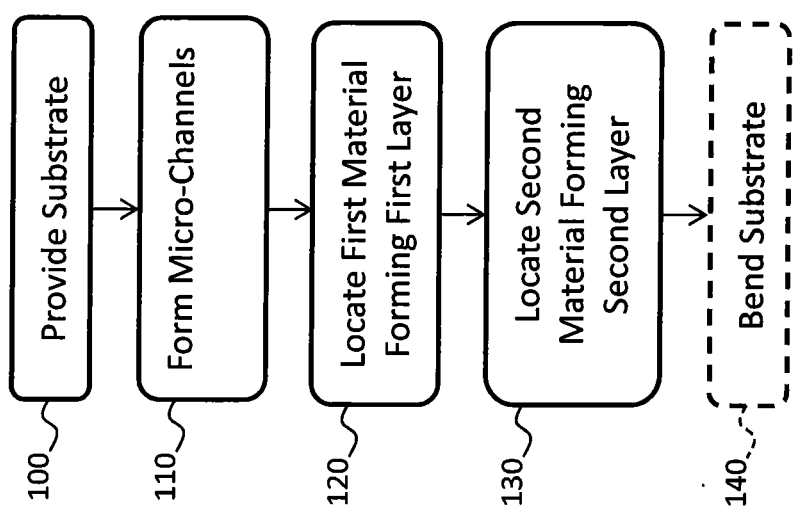

Referring to FIG. 15 in a method of the present invention, the multi-layer micro-wire structure 5 is made by first providing a substrate 40 in step 100. Micro-channels 60 are formed in or on the substrate 40 in step 110. In step 120, the first layer 10 is formed by locating the first material composition 12 in the micro-channels 60. In step 130, the second layer 20 is formed by locating the second material composition 22 in the micro-channels 60. In an embodiment, the first material composition 12 is provided as a conductive ink or the second material composition 22 is provided as a conductive polymer. In an embodiment, the second material composition 22 is a polymer that is coated as a liquid, for example by spin, hopper, or curtain coating, and then cured. Coating and curing methods for polymers are well known in the art.

In a useful method of the present invention, the substrate 40 is arranged in a flat configuration during step 110. By flat is meant that an imprinting stamp imprints the substrate 40 without objectionable flaws in the imprinted micro-channels 60 due to a misalignment between the orientation of the stamp and the orientation of the substrate 40. In one embodiment, the substrate 40 is parallel to the stamp or to the portion of the stamp that impresses the substrate 40 (ignoring the relief structure of the stamp). In an embodiment, the method of FIG. 15 is employed in a roll-to-roll process in which the substrate 40 is provided in a roll configuration, unrolled for processing (e.g. coating, imprinting, or curing), and then rolled again. When unrolled for processing, the substrate 40 need only have a sufficiently large radius of curvature that the micro-channels 60 of the imprinting step have no objectionable flaws.

In one embodiment of the present invention, the first material composition 12 and the first layer 10 are formed in step 120 before the second layer 20 is formed by locating the second material composition 22 in the micro-channels 60 in step 130, forming the multi-layer micro-wire structure 5 illustrated in FIG. 1. In another embodiment of the present invention, the second layer 20 is formed by locating the second material composition 22 in the micro-channels 60 are formed in step 130 before the first material composition 12 and the first layer 10 in step 120, forming the multi-layer micro-wire structure 5 illustrated in FIG. 2. In either embodiment, the electrically conductive second material composition 22 has a greater tensile ductility than the first material composition 12. In optional step 140, the substrate is bent, wrapped, or curved. In an embodiment, the first and second material compositions 12, 22 are cured material compositions. In a useful method of the present invention, the material composition that is deposited first is only partially cured before the material composition that is deposited second. The step of curing the material composition deposited second then also cures the material composition that is deposited first. In this way, the first and second material compositions 12, 22 are adhered together and have improved electrical connectivity.

Figure 16:
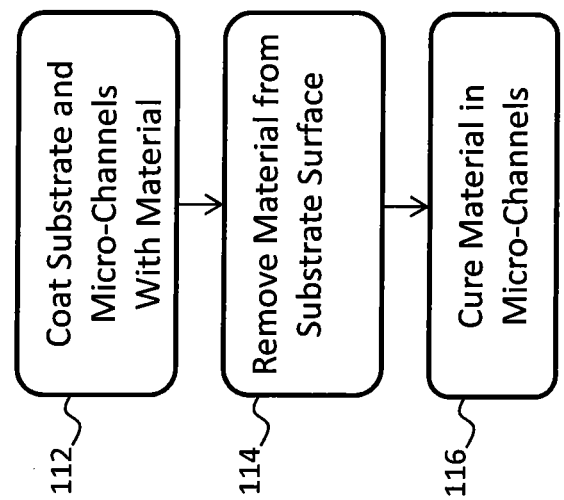

Referring to FIG. 16 in an embodiment, the first material composition 12 is coated over the substrate surface 41 and micro-channels 60 in step 112 and then removed from the substrate surface 41 but not from the micro-channels 60 in step 114. Alternatively, the second material composition 22 is coated over the substrate surface 41 and micro-channels 60 in step 112 and then removed from the substrate surface 41 but not from the micro-channels 60. The material in the micro-channels 60 is cured in step 116. In an embodiment, the first material composition 12 is cured separately from the second material composition 22 in step 116. In another embodiment, the first material composition 12 is cured at the same time as and together with the second material composition 22 in step 116. The curing step 116 can reduce the volume of the first or second material compositions 12, 22, for example by evaporating solvents. In a further embodiment, the first or second material composition 12, 22 is exposed to an HCl vapor. Exposure to an HCl vapor can enhance the conductivity of silver conductive particles 92 in a layer of a multi-layer micro-wire 50.

In an embodiment, the substrate surface 41 is wiped to remove the first or second material composition 12, 22 from the substrate surface 41 between the micro-channels 60. In another embodiment, the substrate surface 41 is wiped to remove a portion of the first or second material composition 12, 22 from the micro-channels 60 so that each micro-channel 60 is only partially filled.

As shown in FIG. 12, the multi-layer micro-wires 50 of the present invention form a plurality of electrically distinct electrodes 52. Each electrode 52 includes a plurality of electrically connected multi-layer micro-wires 50. Referring to FIG. 17, in an embodiment the substrate 10 is coated with the unpatterned conductive layer 70 electrically connected to the electrodes in step 105, as shown in FIGS. 13 and 14. Referring to FIG. 13, the second material composition 22 is coated after the first material composition 12 so that the unpatterned conductive layer 70 is located on the micro-channel top 61 of each micro-channel 60 and not located on the micro-channel bottom 63 of each micro-channel 60. Alternatively, referring to FIG. 14, the second material composition 22 is coated before the first material composition 12 so that the unpatterned conductive layer 70 is located on the micro-channel sides 62 and micro-channel bottom 63 of each micro-channel 60.

Referring to FIG. 18, in another embodiment of the present invention, a third layer 30 is located in the micro-channel 60 on a side of the second layer 20 opposite the first layer in step 135. The third layer 30 includes the first material composition 12. In an alternative embodiment of the present invention, the third layer 30 is located in the micro-channel 60 on a side of the first layer 10 opposite the second layer 20. The third layer 30 includes the second material composition 22. In yet another embodiment, the third layer 30 includes a third electrically conductive material composition and is located in the micro-channel 60 between the first and second layers 10, 20 or located on the micro-channel top 61 of the micro-channel 60 (as shown in FIGS. 7-11).

In a useful method of the present invention, referring to FIG. 19, an underlying substrate is provided in step 100 and an uncured curable layer provided on the underlying substrate in step 210. In an embodiment, the underlying substrate and the cured layer form the substrate 40 and the surface of the cured layer opposite the underlying substrate forms the substrate surface 41. The curable layer is provided, for example by spin, hopper, or curtain coating a cross-linkable resin. Such materials and methods are known in the prior art.

A stamp is provided in step 205 and used to imprint micro-channels 60 in the curable layer in step 215. The curable layer is cured in step 220 to form micro-channels 60 in the cured layer. Conductive ink is provided in step 225, for example by coating the substrate 40 and micro-channels 60 with the conductive ink and then removing the conductive ink from the substrate surface 41 leaving conductive ink in the micro-channels 60. In step 230, the conductive ink is cured to form a conductor. In an embodiment, the cured conductive ink is the first material composition 12. Imprinting stamps, imprinting methods, and conductive inks are known in the art.

In an embodiment, a conductive layer is coated over the curable layer in optional step 212. When the micro-channels 60 are imprinted, the conductive layer is located on at least a portion of the sides and bottom of the micro-channels 60. When the conductive ink is cured in the micro-channels 60, the conductive layer and the conductive ink form the second and first material compositions 22, 12, forming the multi-layer micro-wire 50 in each micro-channel 60 and the unpatterned conductive layer 70 of an embodiment of the present invention, as shown in FIG. 14. Alternatively the cured layer and the cured conductive ink are coated with a conductive layer to form a multi-layer micro-wire 50 in each micro-channel 60 and the unpatterned conductive layer 70, as shown in FIG. 13. If the conductive layer is removed from the substrate surface 41 before the conductive material (the second material composition 22) is cured, the multi-layer micro-wire structure 5 of FIG. 1 or 2 results.

The unpatterned conductive layer 70 is useful for reducing electromagnetic interference in the multi-layer micro-wire structure 5 of the present invention. In particular, the electrodes 52 on a side of the unpatterned conductive layer 70 opposite a source of electromagnetic interference experience reduced signal noise when used to detect currents in the electrodes 52. When used to form a capacitive touch screen, the presence of the unpatterned conductive layer 70 also increases capacitance between the driver and sensor electrodes 52 in the first and second layers 10, 20, thereby reducing the voltage needed to sense changes in the capacitive field, for example due to touches, thereby improving efficiency.

Methods of the present invention provide advantages over the prior art. Additive techniques are less costly than traditional subtractive methods using photolithographic tools, for example including etching. Disclosed methods are applicable to roll-to-roll manufacturing techniques, increasing manufacturing rates and decreasing manufacturing costs. The costs of substrates, materials, and tooling are reduced.

The designation of first or second with respect to material compositions or layers is arbitrary and does not necessarily specify order or structure. Thus, depending on the embodiment of the present invention, first layer 10 is formed on second layer 20 or second layer 20 is formed on first layer 10. In any specific example or embodiment, the first or second material composition or layer designations can be reversed without changing the nature of the invention.

Different materials coated in separate layers over patterned substrates are known. In contrast, the multi-layer micro-wires 50 of the present invention are formed in the micro-channels 60 and not over the substrate surface 41 of the substrate 40 and can have a narrow width and extend into the substrate 40. Conventional substrate deposition and patterning methods, for example using sputtering to form a layer and then coated photo-resist with masked exposure to pattern a substrate are problematic or expensive, especially for such high-aspect ratio conductive structures, and can involve extensive subtractive processing, for example etching. Although it is known to form conventional micro-wires, the multi-layer micro-wires 50 of the present invention are structured multi-layer micro-wires 50 having at least the first and second layers 10, 20. Such structured multi-layered micro-wires 50 are not known in the prior art and provide advantages as disclosed herein.

The first or second material compositions 12, 22 can be provided in one state and then processed into another state, for example converted from a liquid state into a solid state, to form a layer. Such conversion can be accomplished in a variety of ways, for example by drying or heating. Furthermore, the first or second material composition 12, 22 can include a set of materials when located and be processed to include a subset of the set of materials, for example by removing solvents from the material composition. For example, a material composition including a solvent is deposited and then processed to remove the solvent leaving a material composition without the solvent in place. Thus, according to embodiments of the present invention, a deposited material composition is not necessarily the same material composition as that found in a processed layer (e.g. first or second layer 10, 20).

According to various embodiments of the present invention, the first and second layers 10, 20 of the multi-layer micro-wires 50 have different electrical, mechanical, optical, or chemical properties. In useful embodiments, the multi-layer micro-wire 50 includes the first layer 10 located farther from the substrate surface 41 or the micro-channel top 61 than the second layer 20 and the first layer 10 is more electrically conductive than the second layer 20.

The multi-layer micro-wire 50 including the first and second layers 10, 20 formed in the substrate 40 can have a width less than a depth or thickness so that the multi-layer micro-wire 50 has an aspect ratio (depth/width) greater than one. The multi-layer micro-wire 50 can be covered with a protective layer to protect it from scratches or other environmental damage, including mechanical or chemical damage. The protective layer can be formed over just the multi-layer micro-wire 50 or over a more extensive portion of the substrate surface 41.

A layer need not continuously cover another layer in the multi-layer micro-wire 50 (not shown). In an embodiment, the first layer 10 completely covers the micro-channel top 61 or the second layer 20. In another embodiment, the second layer 20 completely covers the micro-channel top 61 or the first layer 10. Alternatively, the first layer 10 covers only a portion of the micro-channel top 61 or the second layer 20. In another embodiment, the second layer 20 covers only a portion of the micro-channel top 61 or the first layer 10.

In various embodiments of the present invention, the multi-layer micro-wire 50 has a width less than or equal to 10 microns, 5 microns, 4 microns, 3 microns, 2 microns, or 1 micron. Likewise, the micro-channel 60 has a width less than or equal to 20 microns, 10 microns, 5 microns, 4 microns, 3 microns, 2 microns, or 1 micron. In some embodiments, the multi-layer micro-wire 50 can fill the micro-channel 60; in other embodiments the multi-layer micro-wire 50 does not fill the micro-channel 60.

In an embodiment, the first or second layer 10, 20 is solid. In another embodiment, the first or second layer 10, 20 is porous. The first or second material composition 12, 22 can include conductive particles 92 (or light-absorbing particles) in a liquid carrier (for example an aqueous solution). The liquid carrier can be located in the micro-channels 60 and heated or dried to remove the liquid carrier, leaving a porous assemblage of the conductive particles 92 that can be sintered to form a porous electrical conductor in a layer.

Electrically conductive multi-layer micro-wire structures 5 and methods of the present invention are useful for making electrical conductors in transparent micro-wire electrodes (e.g. electrodes 52) and for electrical conductors in general, for example as used in busses. A variety of micro-wire patterns can be used and the present invention is not limited to any one pattern. The multi-layer micro-wires 50 can be spaced apart, form separate electrical conductors, or intersect to form a mesh electrical conductor in the substrate 40, as illustrated in FIG. 12. The micro-channels 60 can be identical or have different sizes, aspect ratios, or shapes. Similarly, the multi-layer micro-wires 50 can be identical or have different sizes, aspect ratios, or shapes. The multi-layer micro-wires 50 can be straight or curved.

Electrically conductive micro-layer micro-wire structures 5 of the present invention are useful, for example in touch screens such as projected-capacitive touch screens that use transparent micro-wire electrodes 52 and in displays. Electrically conductive multi-layer micro-wire structures 5 can be located in areas other than display areas, for example in the perimeter of the display area of a touch screen, where the display area is the area through which a user views a display.

When used in display systems, the multi-layer micro-wires 50 of the present invention provide an advantage in that when the substrate 40 is flexed, for example, by adhering the substrate 40 to a curved surface, the multi-layer micro-wires 50 continue to conduct electricity.

First layer 10 or second layer 20 can have a color or be reflective. U.S. Patent Application Publication No. 2008/0257211 discloses a variety of metallic colored inks and its contents are hereby incorporated by reference.

In various embodiments, the first or second material compositions 12, 22 can include conductive particles 92, for example metal nano-particles such as silver nano-particles. The metal can be silver or a silver alloy or other metals, such as tin, tantalum, titanium, gold, or aluminum, or alloys thereof. The metal nano-particles can be sintered to form a metallic electrical conductor. First or second material compositions 12, 22 can include light-absorbing materials or particles such as carbon black, a dye, or a pigment. In one embodiment, the second material composition 22 includes carbon black, a black dye, or a black pigment and the first material composition 12 includes silver nano-particles.

Conductive inks including metallic particles are known in the art. In useful embodiments, the conductive inks include nano-particles, for example silver, in a carrier fluid such as an aqueous solution. The carrier fluid can include surfactants that reduce flocculation of the metal particles, humectants, thickeners, adhesives and other active chemicals. Once deposited, the conductive inks are cured, for example by heating. The curing process drives out the solution and sinters the metal particles to form a metallic electrical conductor. Conductive inks are known in the art and are commercially available.

In a useful embodiment, a material composition having conductive particles 92 and (optionally) light-absorbing particles in a liquid carrier is located in the micro-channel 60. The material composition is processed, for example by drying, heating, or treatment with hydrochloric acid to remove the liquid carrier and agglomerate conductive particles 92.

Curing material compositions to form layers (first or second layers 10, 20) or adhering the layers to each other or to substrate 40 can be done by drying or heating. In particular, if micro-channel 60 is formed in a polymer layer, heating the polymer layer slightly can soften the polymer so that particles, for example black pigment or carbon black particles or conductive particles 92, in the first or second material compositions 12, 22 can adhere to the polymer. Such heating can be done by convective heating (putting substrate 40 into an oven) or by infrared radiation. Heating with infrared radiation has the advantage that light-absorbing particles, for example black particles, differentially absorb the infrared radiation and locally heat up the substrate 40 (that can be transparent), thus providing a more efficient adhesion or drying process for a material composition. Adhesion of the first or second layers 10, 20 to the substrate 40 or to each other is advantageous because such adhered layers are more resistant to mechanical abrasion and are thus more environmentally robust.

Conductive ink formulations useful for the present invention are commercially available, as are substrates, substrate coating methods, and micro-patterning methods for forming micro-channels. Curable polymer layers are well known as are method for coating, patterning, and curing them. Light-absorbing materials are also known and can be made into coatable material compositions using techniques known in the chemical arts.

In any of these cases, conductive inks or other conducting materials are conductive after they are cured and any needed processing completed. Deposited materials are not necessarily electrically conductive before patterning or before curing. As used herein, a conductive ink is a material that is electrically conductive after any final processing is completed and the conductive ink is not necessarily conductive at any other point in the multi-layer micro-wire 50 formation process.

According to various embodiments of the present invention, the substrate 40 is any material having the substrate surface 41 in which the micro-channels 60 can be formed. For example, glass and polymer are suitable materials known in the art from which the substrates 40 can be made into sheets of material having substantially parallel opposed sides, one of which is the substrate surface 41. The substrate 40 can be a rigid or a flexible substrate and can have opposing substantially parallel and extensive surfaces. In a useful embodiment, the substrate 40 is substantially transparent, for example having a transparency of greater than 90%, 80% 70% or 50% in the visible range of electromagnetic radiation. The substrates 40 can include a dielectric material useful for capacitive touch screens and can have a wide variety of thicknesses, for example 10 microns, 50 microns, 100 microns, 1 mm, or more. In various embodiments of the present invention, the substrates 40 are provided as a separate structure or are coated on another underlying substrate, for example by coating a polymer substrate layer on an underlying plastic substrate. Such substrates 40 and their methods of construction are known in the prior art. The substrate 40 can be an element of other devices, for example the cover or substrate of a display or a substrate, cover, or dielectric layer of a touch screen. According to embodiments of the present invention, the multi-layer micro-wires 50 extend across at least a portion of substrate 40 in a direction parallel to the substrate surface 41 of substrate 40. In an embodiment, the substrate 40 of the present invention is large enough for a user to directly interact therewith, for example with an implement such as a stylus or with a finger or hand. The substrates of integrated circuits are too small for such interaction.

The micro-channel 60 is a groove, trench, or channel formed in the substrate 40 or a layer coated on an underlying substrate forming the substrate 40 and extending from the substrate surface 41 into the substrate 40 and, in various embodiments, having a cross-sectional width in a direction parallel to substrate surface 41 less than 20 microns, for example 10 microns, 5 microns, 4 microns, 3 microns, 2 microns, 1 micron, or 0.5 microns, or less. In an embodiment, the cross-sectional depth of the micro-channel 60 is comparable to the width. The micro-channels 60 can have a rectangular cross section, as shown. Other cross-sectional shapes, for example trapezoids, are known and are included in the present invention. The first and second layers 10, 20 can have different depths or the same depth. The width or depth of a layer is measured in cross section.

A conductive layer of the multi-layer micro-wires 50 can be metal, for example silver, gold, aluminum, nickel, tungsten, titanium, tin, or copper or various metal alloys including, for example silver, gold, aluminum, nickel, tungsten, titanium, tin, or copper. The multi-layer micro-wires 50 can include a thin metal layer composed of highly conductive metals such as gold, silver, copper, or aluminum. Other conductive metals or materials can be used. Alternatively, the multi-layer micro-wires 50 can include cured or sintered metal particles such as nickel, tungsten, silver, gold, titanium, or tin or alloys such as nickel, tungsten, silver, gold, titanium, or tin. Conductive inks can be used to form multi-layer micro-wires 50 with pattern-wise deposition or pattern-wise formation followed by curing steps. Other materials or methods for forming multi-layer micro-wires 50 can be employed and are included in the present invention.

In an example and non-limiting embodiment of the present invention, each multi-layer micro-wire 50 is from 5 microns wide to one half micron wide and is separated from neighboring multi-layer micro-wires 50 by a distance of 20 microns or less, for example 10 microns, 5 microns, 2 microns, or one micron.

Methods and device for forming and providing substrates, coating substrates, patterning coated substrates, or pattern-wise depositing materials on a substrate are known in the photo-lithographic arts. Likewise, tools for laying out electrodes, conductive traces, and connectors are known in the electronics industry as are methods for manufacturing such electronic system elements. Hardware controllers for controlling touch screens and displays and software for managing display and touch screen systems are well known. These tools and methods are usefully employed to design, implement, construct, and operate the present invention. Methods, tools, and devices for operating capacitive touch screens are used with the present invention.

The present invention is useful in a wide variety of electronic devices. Such devices can include, for example, photovoltaic devices, OLED displays and lighting, LCD displays, plasma displays, inorganic LED displays and lighting, electrophoretic displays, electrowetting displays, dimming mirrors, smart windows, transparent radio antennae, transparent heaters and other touch screen devices such as resistive touch screen devices.

The invention has been described in detail with particular reference to certain embodiments thereof, but it will be understood that variations and modifications can be effected within the spirit and scope of the invention.

PARTS LIST

- 5 multi-layer micro-wire structure
- 10 first layer
- 12 first material composition
- 20 second layer
- 22 second material composition
- 30 third layer
- 32 third material composition
- 40 substrate
- 41 substrate surface
- 42 corner
- 44 gap
- 46 object
- 50 multi-layer micro-wire
- 52 electrodes
- 60 micro-channel
- 61 micro-channel top
- 62 micro-channel side
- 63 micro-channel bottom
- 70 unpatterned conductive layer
- 92 conductive particles
- 99 curved capacitive touch screen
- 100 provide substrate step
- 105 coat substrate with conductive material step
- 110 form micro-channels step
- 112 coat substrate and micro-channels with material step
- 114 remove material from substrate surface step
- 116 cure material in micro-channels step
- 120 locate first material forming first layer step
- 130 locate second material forming second layer step
- 135 locate third material forming third layer step
- 140 bend substrate step
- 205 provide stamp step
- 210 provide curable layer step
- 212 coat conductive layer
- 215 imprint micro-channels in curable layer step
- 220 cure curable layer step
- 225 provide conductive ink in micro-channels step
- 230 cure conductive ink in micro-channels step

The invention claimed is:

1. A multi-layer micro-wire structure resistant to cracking, comprising:

a substrate having a surface;

one or more micro-channels formed in the substrate;

an electrically conductive first material composition forming a first layer located in each micro-channel; and an electrically conductive second material composition having a greater tensile ductility than the first material composition forming a second layer located in each micro-channel, the first material composition and the second material composition in electrical contact to form an electrically conductive multi-layer micro-wire in each micro-channel, wherein the first material composition is susceptible to cracking when the multi-layer micro-wire structure is flexed such that gaps are formed in the first material composition, and wherein the second material composition forms an electrical connection that bridges the formed gaps, whereby the multi-layer micro-wire is resistant to cracking.

2. The multi-layer micro-wire structure of claim 1, wherein the first material composition infuses with the second material composition or the second material composition infuses with the first material composition.

3. The multi-layer micro-wire structure of claim 1, wherein the second material composition is between the first material composition and the surface.

4. The multi-layer micro-wire structure of claim 1, wherein the first material composition is between the second material composition and the surface.

5. The multi-layer micro-wire structure of claim 1, wherein the second material composition is PEDOT or a polyaniline.

6. The multi-layer micro-wire structure of claim 1, wherein the first material composition is a conductive ink.

7. The multi-layer micro-wire structure of claim 1, wherein first material composition includes a metal and the second material composition includes a conductive polymer.

8. The multi-layer micro-wire structure of claim 1, wherein the first or second material composition is light-absorbing or includes carbon black.

9. The multi-layer micro-wire structure of claim 1, wherein the first electrically conductive material composition forming a first layer is located only in each micro-channel and not on the substrate surface or wherein the second electrically conductive material composition forming the second layer is located only in each micro-channel and not on the substrate surface.

10. The multi-layer micro-wire structure of claim 1, wherein the micro-wires are patterned to form a plurality of separate, spaced-apart electrodes, each electrode including a plurality of electrically connected multi-layer micro-wires.

11. The multi-layer micro-wire structure of claim 1, further including a third layer located in the micro-channel on a side of the second layer opposite the first layer, wherein the third layer includes the first material composition;

further including a third layer located in the micro-channel on a side of the first layer opposite the second layer, wherein the third layer includes the second material composition; or further including a third electrically conductive material composition forming a third layer located on the bottom of the micro-channel, located in the micro-channel between the first and second layers, or located in the top of the micro-channel.

12. The multi-layer micro-wire structure of claim 1, wherein the substrate has a three-dimensional configuration, is curved, or is wrapped around a corner of a three-dimensional object.

13. The multi-layer micro-wire structure of claim 12, wherein the multi-layer micro-wires form overlapping electrode arrays defining capacitors of a capacitive touch screen.

14. A multi-layer micro-wire structure resistant to cracking, comprising:
a substrate having a surface;
one or more micro-channels formed in the substrate;
an electrically conductive first material composition forming a first layer located in each micro-channel; and
an electrically conductive second material composition having a greater tensile ductility than the first material composition forming a second layer located in each micro-channel, the first material composition and the second material composition in electrical contact to form an electrically conductive multi-layer micro-wire in each micro-channel, whereby the multi-layer micro-wire is resistant to cracking;
wherein the micro-wires are patterned to form a plurality of separate, spaced-apart electrodes, each electrode including a plurality of electrically connected multi-layer micro-wires;
further including an unpatterned conductive layer electrically connected to the electrodes.

15. The multi-layer micro-wire structure of claim 14, wherein the unpatterned conductive layer includes the second material composition or includes the first material composition.

16. The multi-layer micro-wire structure of claim 14, wherein the second material composition is at least partly located on the sides and bottom of each micro-channel.

17. The multi-layer micro-wire structure of claim 14, wherein the unpatterned conductive layer is located on the substrate surface.

18. A multi-later micro-wire structure resistant to cracking, comprising:
a substrate having a surface;
one or more micro-channels formed in the substrate;
an electrically conductive first material composition forming a first layer located in each micro-channel; and
an electrically conductive second material composition having a greater tensile ductility than the first material composition forming a second layer located in each micro-channel, the first material composition and the second material composition in electrical contact to form an electrically conductive multi-layer micro-wire in each micro-channel, whereby the multi-layer micro-wire is resistant to cracking;
further including a third layer located in the micro-channel on a side of the second layer opposite the first layer, wherein the third layer includes light-absorbing material.

* * * * *